(12) United States Patent
Shao et al.

(10) Patent No.: US 12,317,483 B2
(45) Date of Patent: May 27, 2025

(54) SEMICONDUCTOR STRUCTURE HAVING ISOLATION STRUCTURE EMBEDDED IN THE GROOVE OF THE BIT LINE

(71) Applicant: CHANGXIN MEMORY TECHNOLOGIES, INC., Hefei (CN)

(72) Inventors: Guangsu Shao, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 359 days.

(21) Appl. No.: 17/954,221

(22) Filed: Sep. 27, 2022

(65) Prior Publication Data

US 2023/0025471 A1 Jan. 26, 2023

(30) Foreign Application Priority Data

Jul. 18, 2022 (CN) .......................... 202210843726.6

(51) Int. Cl.
*H10B 12/00* (2023.01)
(52) U.S. Cl.
CPC ......... *H10B 12/482* (2023.02); *H10B 12/053* (2023.02); *H10B 12/34* (2023.02); *H10B 12/488* (2023.02)

(58) Field of Classification Search
CPC .... H10B 12/053; H10B 12/34; H10B 12/482; H10B 12/485; H10B 12/488
USPC ......................................... 257/906, 907, 908
See application file for complete search history.

(56) References Cited

U.S. PATENT DOCUMENTS

2014/0061745 A1\* 3/2014 Myung .................. H10D 30/63
257/532

\* cited by examiner

*Primary Examiner* — Hoai V Pham
(74) *Attorney, Agent, or Firm* — Kilpatrick Townsend & Stockton LLP

(57) ABSTRACT

Embodiments relate to a semiconductor structure and a method for fabricating. The semiconductor structure includes: a substrate, word lines, bit lines, and word line isolation structures. Active pillars arranged in an array are provided on a surface of the substrate, and the active pillars include channel regions, and a top doped region positioned on an upper side of the channel region and a bottom doped region positioned on a lower side of the channel region. The word lines extend along a first direction and surround the channel regions of a row of the active pillars arranged along the first direction. The bit lines extend along a second direction and are electrically connected to the bottom doped regions of a column of the active pillars arranged along the second direction, and in a direction facing away from the surface of the substrate.

11 Claims, 11 Drawing Sheets

SEMICONDUCTOR STRUCTURE HAVING ISOLATION STRUCTURE EMBEDDED IN THE GROOVE OF THE BIT LINE

CROSS-REFERENCE TO RELATED APPLICATION

This application claims priority to Chinese Patent Application No. 202210843726.6, titled "METHOD FOR DATA STORAGE AND COMPARISON, STORAGE COMPARISON CIRCUIT DEVICE, AND SEMICONDUCTOR MEMORY" and filed to the State Patent Intellectual Property Office on Jul. 18, 2022, the entire contents of which are incorporated herein by reference.

TECHNICAL FIELD

Embodiments of the present disclosure relate to the field of semiconductor technology, and more particularly, to a semiconductor structure and a method for fabricating the same.

BACKGROUND

As a dynamic memory develops toward a higher direction of an integration density, there are higher requirements for arrangement modes and sizes of transistors in a dynamic memory array structure. When a gate-all-around transistor structure is used as a transistor in the dynamic memory, a smaller pattern size may be obtained under given process conditions, which is advantageous to increasing the integration density of the dynamic memory.

Generally, when a plurality of transistors are integrated in a semiconductor structure, to improve an integration level, one word line may be provided to control the plurality of transistors. On this basis, word line isolation structures need to be provided between the adjacent word lines to prevent occurrence of short circuits between the adjacent word lines.

However, in the existing semiconductor structure and fabrication processes thereof, the word line isolation structures are prone to distortion, tilt or even breakage.

SUMMARY

A semiconductor structure and a method for fabricating the same provided in embodiments of the present disclosure are at least advantageous to improving a problem that word line isolation structures configured to isolate adjacent word lines are prone to distortion or tilt.

The embodiments of the present disclosure provide a semiconductor structure, including: a substrate, word lines, bit lines, and word line isolation structures. Active pillars arranged in an array are provided on a surface of the substrate, and the active pillars include channel regions, and a top doped region positioned on an upper side of the channel region and a bottom doped region positioned on a lower side of the channel region. The word lines extend along a first direction and surround the channel regions of a row of the active pillars arranged along the first direction. The bit lines extend along a second direction and are electrically connected to the bottom doped regions of a column of the active pillars arranged along the second direction, and in a direction facing away from the surface of the substrate, the bit lines have grooves between bottoms of adjacent two of the active pillars connected to the bit lines. The word line isolation structures are positioned between adjacent word lines, the word line isolation structures include bodies and protruding portions extending from bottoms of the bodies, and the protruding portions are embedded in the grooves. The first direction and the second direction are perpendicular to each other, and are both parallel to the surface of the substrate.

Correspondingly, another aspect of the embodiments of the present disclosure further provides a method for fabricating a semiconductor structure. The method includes: providing a substrate; forming active pillars arranged in an array on a surface of the substrate, where the active pillars include channel regions, and a top doped region positioned on an upper side of the channel region and a bottom doped region positioned on a lower side of the channel region; forming bit lines, where the bit lines extend along a second direction and are electrically connected to the bottom doped regions of a column of the active pillars arranged along the second direction, and in a direction facing away from the surface of the substrate, the bit lines have grooves between bottoms of adjacent active pillars connected to the bit lines; forming word line isolation structures, where the word line isolation structures extend along a first direction, the first direction and the second direction are perpendicular to each other and are both parallel to the surface of the substrate, the word line isolation structures include bodies and protruding portions extending from bottoms of the bodies, and the protruding portions are embedded in the grooves; and forming word lines, where the word lines extend along the first direction and surround the channel regions of a row of the active pillars arranged along the first direction, and the word line isolation structures are positioned between adjacent word lines.

BRIEF DESCRIPTION OF THE DRAWINGS

Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

As can be known from the background art, in an existing semiconductor structure, word line isolation structures configured to isolate adjacent word lines are prone to distortion or tilt.

Based on analysis, it is found that one of the reasons that cause the word line isolation structures to be prone to distortion or tilt is that in existing processes of forming the semiconductor structure, the word line isolation structures are generally formed first, and then the word lines and bit lines are formed. In some embodiments, the bit lines are formed first, the bit lines are electrically connected to doped regions in active pillars. Next, the word line isolation structures and sacrificial layers positioned on side walls of the word line isolation structures are formed between the adjacent active pillars, the sacrificial layers are then removed to expose side surfaces of channel regions of the active pillars, and the word lines are formed on side surfaces of the channel regions. However, after the sacrificial layers positioned on the side walls of the word line isolation structures are removed, the side walls of the word line isolation structures are not supported by the sacrificial layers, such that the word line isolation structures formed are prone to distortion or even collapse.

Embodiments of the present disclosure provide a semiconductor structure, the bit lines are electrically connected to bottom doped regions of a column of active pillars, the bit lines have grooves between the adjacent active pillars, and protruding portions in the word line isolation structures are embedded in the grooves. In this way, support force is provided to two sides of the word line isolation structures, such that the word line isolation structures are not prone to tilt or collapse.

The embodiments of the present disclosure will be described in detail below in conjunction with the accompanying drawings. However, a person of ordinary skill in the art may understand that in the embodiments of the present disclosure, many technical details are put forward such that a reader can better understand the present disclosure. However, the technical solutions requested to be protected by the present disclosure may also be implemented even without these technical details or various variations and modifications based on the following embodiments.

Figure 1:
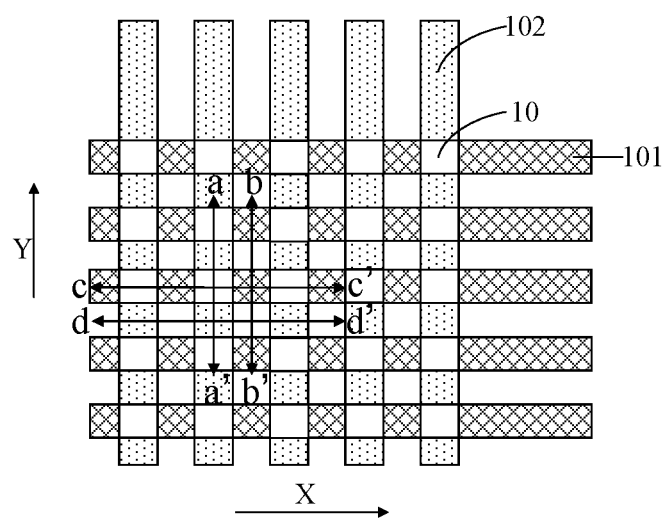
FIG. 1 is a schematic top-down view of a method for fabricating a semiconductor structure according to an embodiment of the present disclosure.
Figure 2:
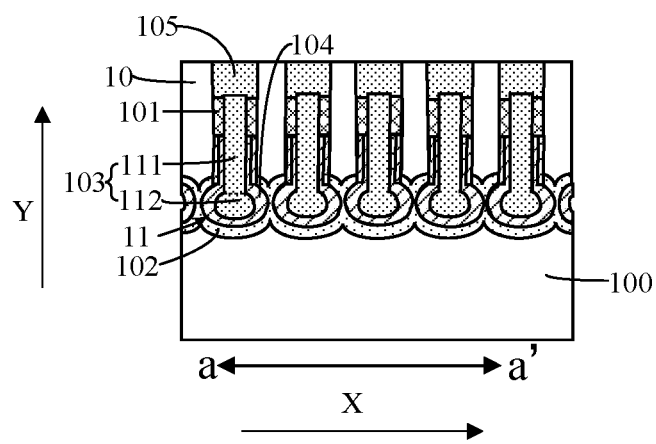
FIG. 2 is a schematic cross-sectional structural diagram along a direction aa' in FIG. 1.
Figure 3:
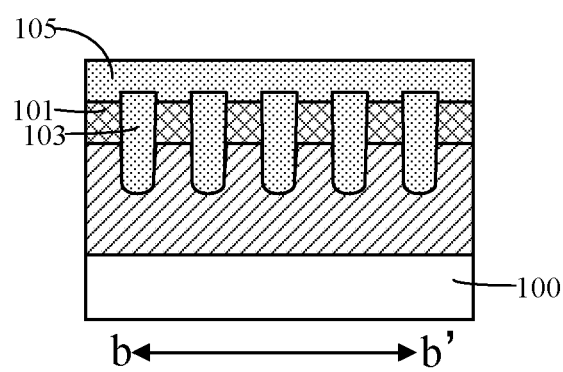
FIG. 3 is a schematic cross-sectional structural diagram along a direction bb' in FIG. 1.
Figure 4:
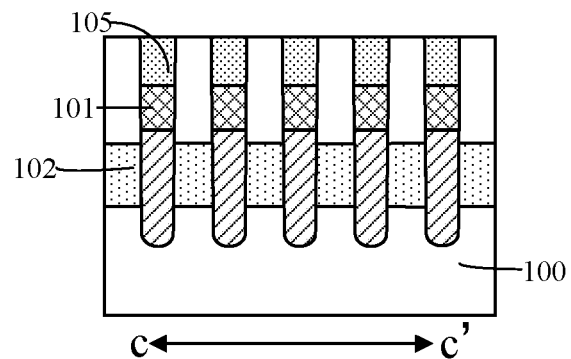
FIG. 4 is a schematic cross-sectional structural diagram along a direction cc' in FIG. 1.
Figure 5:
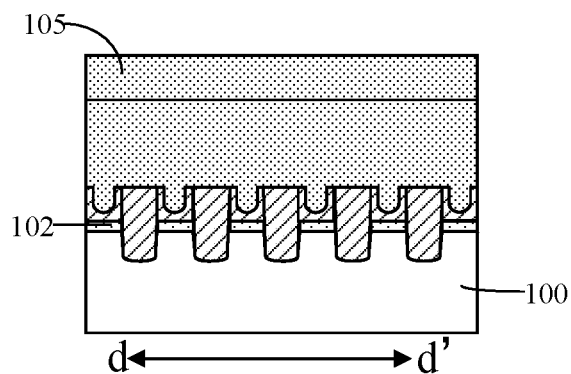
FIG. 5 is a schematic cross-sectional structural diagram long a direction dd' in FIG. 1.
Figure 6:
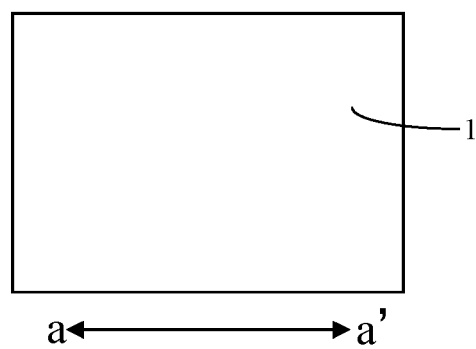
FIGS. 6 to 37 are schematic structural diagrams corresponding to steps of a method for fabricating a semiconductor structure according to another embodiment of the present disclosure.
Figure 7:
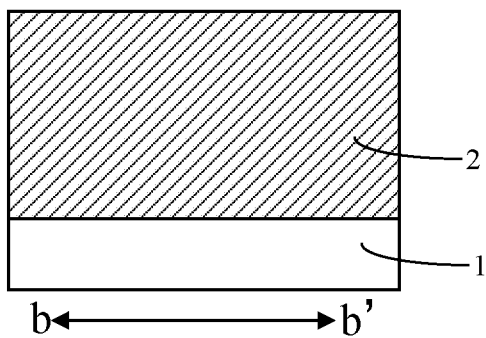
Figure 8:
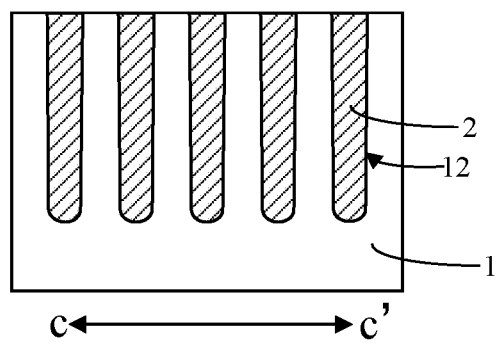
Figure 9:
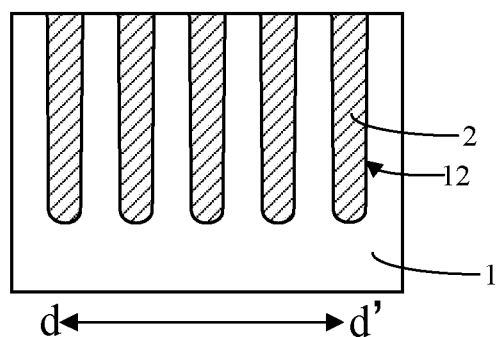
Figure 10:
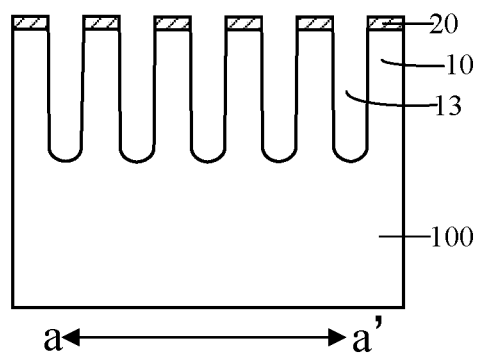
Figure 11:
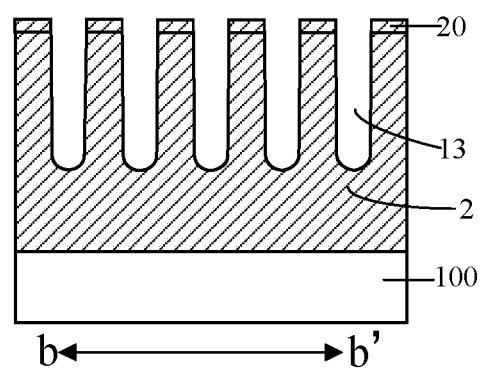
Figure 12:
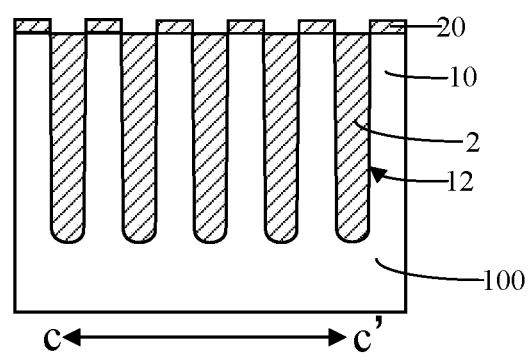
Figure 13:
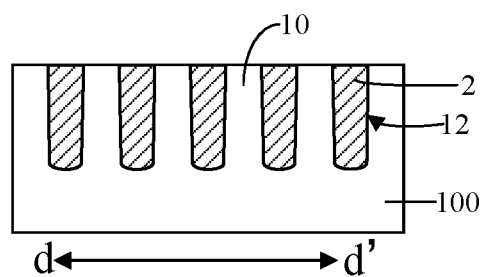
Figure 14:
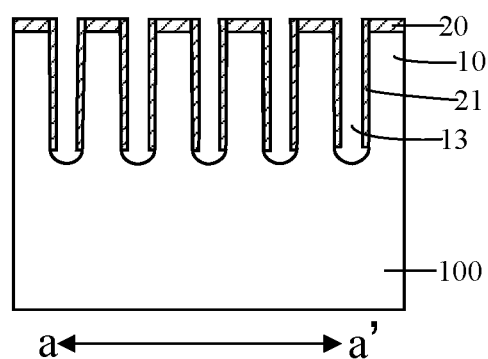

FIG. 1 is a schematic top-down view of a method for fabricating a semiconductor structure according to an embodiment of the present disclosure; FIG. 2 is a schematic cross-sectional structural diagram along a direction aa' in FIG. 1; FIG. 3 is a schematic cross-sectional structural diagram along a direction bb' in FIG. 1; FIG. 4 is a schematic cross-sectional structural diagram along a direction cc' in FIG. 1; and FIG. 5 is a schematic cross-sectional structural diagram long a direction dd' in FIG. 1.

Referring to FIGS. 1 to 5, the semiconductor structure includes: a substrate 100, word lines 101, bit lines 102, and word line isolation structures 103. Active pillars 10 arranged in an array are provided on a surface of the substrate 100, and the active pillars 10 include channel regions, and a top doped region positioned on an upper side of the channel region and a bottom doped region positioned on a lower side of the channel region. The word lines 101 extend along a first direction X and surround the channel regions of a row of the active pillars 10 arranged along the first direction X. The bit lines 102 extend along a second direction Y and are electrically connected to the bottom doped regions of a column of the active pillars 10 arranged along the second direction Y, and in a direction facing away from the surface of the substrate 100, the bit lines 102 have grooves 11 between bottoms of adjacent active pillars 10 connected to the bit lines 102. The word line isolation structures 103 are positioned between adjacent word lines 101, the word line isolation structures 103 include bodies 111 and protruding portions 112 extending from bottoms of the bodies 111, and the protruding portions 112 are embedded in the grooves 11. The first direction X and the second direction Y are perpendicular to each other, and are both parallel to the surface of the substrate.

The substrate 100 may be a semiconductor substrate or a silicon-on-insulator substrate. In some embodiments, the substrate 100 may be a silicon substrate. In some other embodiments, the substrate 100 may also be a germanium substrate, a silicon germanium substrate or a silicon carbide substrate.

The semiconductor structure may be a memory, such as Dynamic Random Access Memory (DRAM), Static Random-Access Memory (SRAM) or Synchronous Dynamic Random-Access Memory (SDRAM).

The word lines 101 are provided to surround the channel regions of a row of the active pillars 10 arranged along the first direction X, such that transistors formed for the semiconductor structure are gate-all-around transistors. The gate-all-around transistors may obtain the smallest pattern size under given process conditions, which is advantageous to increasing the integration density of the semiconductor structure. A material of the active pillars 10 may be the same as that of the substrate 100, for example, may be the silicon substrate 100. The top doped regions are arranged on the sides of the channel regions distant from the substrate 100, and the bottom doped regions are arranged on the sides of the channel regions facing the substrate 100. The channel regions are configured to form the channel regions of the transistors, and the top doped regions and the bottom doped regions are respectively configured to form either sources or drains of the transistors.

In some embodiments, types of doping ions in the top doped regions and types of doping ions in the bottom doped regions may be the same as types of doping ions in the channel regions, to form junctionless transistors. In some other embodiments, the types of the doping ions in the top doped regions and the types of the doping ions in the bottom doped regions may also be different from the types of the doping ions in the channel regions, to form junction transistors. In some embodiments, the types of the doping ions in the top doped regions and the types of the doping ions in the bottom doped regions may be P-type doping ions, such as at least one of boron ions, indium ions, or gallium ions. In some other embodiments, the types of the doping ions in the top doped regions and the types of the doping ions in the bottom doped regions may also be N-type doping ions, such as at least one of arsenic ions, phosphorus ions, or antimony ions.

An arrangement manner of the active pillars 10 may be an array arrangement. Rows of the active pillars 10 are arranged in the first direction X, and columns of the active pillars 10 are arranged in the second direction Y, where the first direction X is different from the second direction Y. It should be noted that the definitions of "row" and "column" are relative. That is, the arrangement direction of the rows may also be defined as the second direction YX, and the arrangement direction of the columns may be defined as the first direction XY.

The grooves 11 are positioned between the bottoms of the adjacent active pillars 10. It is to be understood that the grooves 11 herein do not refer to the grooves 11 positioned in the bit lines 102, but refer to the grooves between the bottoms of the adjacent active pillars 10 in the second direction Y. The bit lines 102 have shapes of the grooves 11. That is, the bit lines 102 are recessed toward the substrate 100 to form the shapes of the grooves 11. The protruding portions 112 are embedded in the grooves 11, such that the side walls of the grooves 11 may provide support force to the word line isolation structures 103, thereby avoiding the problem that the word line isolation structures 103 are collapsed due to loss of the support force on two sides of the word line isolation structures 103 in the process of forming the word lines 101. Moreover, only the protruding portions 112 are embedded in the grooves 11, such that no process damage is caused to the bit lines 102 when the sacrificial layers on the side walls of the bodies 111 are removed to expose the channel regions of the active pillars 10 in the process of forming the word lines 101.

In some embodiments, along the second direction Y, width sizes of the protruding portions 112 are greater than width sizes of the bodies 111. That is, the word line isolation structures 103 have big-end-down shapes, and bottom sizes of the word line isolation structures 103 are larger, such that centers of gravity of the word line isolation structures 103 are lowered, thereby improving stability of the word line isolation structures 103, which is advantageous to further avoiding the problem that the word line isolation structures 103 are prone to distortion or tilt.

Considering that the widths of the protruding portions 112 need to be set larger such that the centers of gravity of the word line isolation structures 103 are lower, thereby improving the stability of the word line isolation structures 103. In another aspect, it is also necessary to set the width sizes of the bodies 111 not to be too small compared to the width sizes of the protruding portions 112, such that a contact area between the bodies 111 and the protruding portions 112 is larger, and thus connection between the bodies 111 and the protruding portions 112 is firmer. On this basis, in some embodiments, along the second direction Y, a ratio of a maximum width size of the protruding portions 112 to the width sizes of the bodies 111 is 1.5 to 2. Within this range, in one aspect, the width sizes of the protruding portions 112 are larger than the width sizes of the bodies 111, such that the centers of gravity of the word line isolation structures 103 are lowered. In another aspect, within this range, the width sizes of the bodies 111 are not too small compared to the width sizes of the protruding portions 112. That is, the width sizes of the bodies 111 are not too small, such that the problem that the bodies 111 are prone to distortion or tilt due to a too large difference between the width sizes of the bodies 111 and the width sizes of the protruding portions 112 may be avoided. In addition, the width sizes of the bodies 111 are set to be not too small, such that the word line isolation structures 103 may also better insulate the adjacent word lines 101. In some embodiments, along the second direction Y, the width sizes of the protruding portions 112 are 5 to 20 nm. Within this range, the width sizes of the protruding portions 112 are not too large, such that an overall size of the semiconductor structure may be maintained smaller, which is advantageous to improving the integration degree of the semiconductor structure.

It is to be understood that the protruding portions 112 are positioned in the grooves 11 to stabilize the entire word line isolation structures 103. The bodies 111 are arranged between the adjacent word lines 101 to isolate the adjacent word lines 101, which can avoid occurrence of electrical interference between the adjacent word lines 101. On this basis, in some embodiments, in the direction perpendicular to the surface of the substrate 100, a ratio of height sizes of the bodies 111 to height sizes of the protruding portions 112 is 5 to 10. Within this range, in one aspect, the heights of the bodies 111 are much larger than the heights of the protruding portions 112, such that it is ensure that the bodies 111 can effectively isolate the adjacent word lines 101. In another aspect, within this range, the heights of the protruding portions 112 are not too small, such that a proportion of the protruding portions 112 in the entire word line isolation structures 103 is not too small, and thus after the protruding portions 112 are embedded in the grooves 11, the protruding portions 112 may effectively stabilize the word line isolation structures 103, to avoid occurrence of tilt or collapse of the word line isolation structures 103.

In some embodiments, along the second direction Y, cross-sectional shapes of the protruding portions 112 may be any one of an ellipse or a polygon. Compared with gradual increase in widths of the protruding portions 112, the cross-sectional shapes of the protruding portions 112 are set to be the ellipse or the polygon, such that the protruding portions 112 may be more firmly embedded in the grooves 11, thus the protruding portions 112 are not easy to slip from the grooves 11. In this way, the problem that the word line isolation structures 103 are prone to distortion or tilt may be further improved. In some embodiments, the cross-sectional shapes of the grooves 11 may correspond to the cross-sectional shapes of the protruding portions 112. That is, when the cross-sectional shapes of the protruding portions 112 are an oval, the cross-sectional shapes of the grooves 11 may also be an oval. When the cross-sectional shapes of the protruding portions 112 are the polygon, the cross-sectional shapes of the grooves 11 may also be the polygon. This is because in the actual fabrication process, when the protruding portions 112 are formed in the grooves 11 by means of a deposition process, the shapes of the protruding portions 112 formed correspond to the shapes of the grooves 11. Therefore, the cross-sectional shapes of the grooves 11 may be set to correspond to the cross-sectional shapes of the protruding portions 112, which may simplify the actual fabrication process of the protruding portions 112.

In some embodiments, the width sizes of the bodies 111 in the second direction Y decreases gradually in the direction facing away from the surface of the substrate 100. In this way, in one aspect, the centers of gravity of the word line isolation structures 103 may be further moved toward the direction of the substrate 100, thereby improving the stability of the word line isolation structures 103. In another aspect, because the width sizes of the bodies 111 on the sides facing away from the substrate 100 are smaller, in the process of actually fabricating the word lines 101, when the sacrificial layers on two sides of the bodies 111 are removed, opening sizes of voids between the bodies 111 and the active pillars 10 are larger, which is advantageous to ensuring that the filling openings of the word lines 101 are larger, such that the word lines 101 formed have better continuity.

In some embodiments, the semiconductor structure further includes buffer layers 104, where the buffer layers 104 are positioned between the protruding portions 112 and the bit lines 102, and the buffer layers 104 further wrap the protruding portions 112 and fill the voids between the protruding portions 112 and the grooves 11. That is, the protruding portions 112 are embedded in the buffer layers. The buffer layers 104 interact with the protruding portions 112. When the buffer layers 104 support the side walls of the protruding portions 112, the protruding portions 112 also apply a force on the buffer layers 104. Therefore, the buffer layers 104 are arranged between the grooves 11 and the bit lines 102, such that the problem of causing damage to the bit lines 102 caused by the protruding portions 112 directly touching the bit lines 102 may be prevented. In addition, the larger the thicknesses of the buffer layers 104 are, the smaller the width sizes of the protruding portions 112 are; and the smaller the thicknesses of the buffer layers 104 are, the larger the width sizes of the protruding portions 112 are. Therefore, the buffer layers 104 may also play a role in controlling the width sizes of the protruding portions 112.

In some embodiments, a material of the buffer layers 104 may be silicon oxide, and a material of the word line isolation structures 103 may be silicon nitride. In some other embodiments, the material of the word line isolation structures 103 may be other insulating materials, such as silicon oxynitride or high-K dielectric materials.

In some other embodiments, the protruding portions 112 may also fill up the grooves 11. The protruding portions 112 are all filled in the grooves 11, and the process of forming the buffer layers 104 may be saved, such that the process flow may be simplified.

The bit lines 102 are electrically connected to the bottom doped regions of a column of the active pillars 10 arranged along the second direction Y, to provide external signals to the transistors formed by the semiconductor structure. In some embodiments, materials of the bit lines 102 include at least one of metal silicides or metals. In some embodiments, the materials of the bit lines 102 may only include the metal silicides, such as $TiSi_2$, $CoSi_2$ and $NiSi_2$, etc. By setting the materials of the bit lines 102 as the metal silicides, it is advantageous to forming continuous film layers of the bit lines 102 extending in the second direction Y. This is because, in the process of actually fabricating the bit lines 102, the substrate 100 needs to be etched to expose the bottom doped regions of the active pillars 10. However, due to process reasons, there still exists an incompletely etched substrate 100 between the bottom doped regions of the adjacent active pillars 10. On this basis, the materials of the bit lines 102 are set as the metal silicides, such that the incompletely etched substrate 100 between the bottom doped regions of the adjacent active pillars 10 is converted into the metal silicides by means of a silicon metallization process. In this way, the continuous film layers of the bit lines 102 extending in the second direction Y may be formed. In some other embodiments, the materials of the bit lines 102 may only include metals, for example, at least one of tungsten, molybdenum, titanium, cobalt or ruthenium. The metals have lower resistance, which is advantageous to improving electrical transmission performance of the bit lines 102. In yet some other embodiments, the materials of the bit lines 102 may also be a stacked structure formed of the metal silicides and the metals, such that the resistance of the bit lines 102 may be reduced on the basis of ensuring the formation of continuous film layers of the bit lines 102, thereby improving the electrical transmission performance of the bit lines 102.

The word lines 101 extend along the first direction X and surround the active pillars 10 of the channel region. The word lines 101 serve as gates of the transistors and are configured to conduct the channel region based on a control signal to achieve transmission of carriers between the sources and the drains. Materials of the word lines 101 are conductive materials. In some examples, the materials of the word lines 101 include at least one of polysilicon, tungsten, molybdenum, titanium, cobalt, or ruthenium.

In some embodiments, the semiconductor structure further includes gate oxide layers (not shown), which are positioned between the channel regions and the word lines 101, and are configured to isolate the word lines 101 from the active pillars 10 of the channel region. The presence of the gate oxide layers makes the transistors formed of the semiconductor structure become low-voltage devices. That is, due to the arrangement of the gate oxide layers, the transistors can be turned on by applying a smaller voltage to complete write of data, which is advantageous to improving the performance of the semiconductor structure. In some embodiments, a material of the gate oxide layers may include silicon oxide. In some embodiments, the semiconductor structure further includes barrier layers, where the barrier layers are positioned between the gate oxide layers and the word lines 101 to prevent ions in the gate oxide layers and the word line s101 from interdiffusion, and a material of the barrier layers may include titanium nitride.

In some embodiments, the semiconductor structure further includes capping layers, where the capping layers are positioned on sides of the word line isolation structures 103 distant from the substrate 100, and the capping layers further cover tops of the word lines 101 and fill voids between adjacent top doped regions. The capping layers play a role of protecting the tops of the word lines 101 to prevent from causing process damage to the word lines 101 in the process of actually fabricating the semiconductor structure. Moreover, the capping layers are also configured to isolate the word lines 101 from other conductive structures in the semiconductor structure, to prevent occurrence of electrical interference between the word lines 101 and the other conductive structures in the semiconductor structure. In some embodiments, a material of the capping layer may be silicon nitride.

In the semiconductor structure provided in the above embodiment, the bit lines 102 are electrically connected to the bottom doped regions of a column of active pillars 10, the bit lines 102 have the grooves 11 between the adjacent active pillars 10, and the protruding portions 112 in the word line isolation structures 103 are embedded in the grooves 11. In this way, support force is provided to two sides of the word line isolation structures 103, such that the word line isolation structures 103 are not prone to tilt or collapse.

Correspondingly, another aspect of the embodiments of the present disclosure also provides a method for fabricating the semiconductor structure, and the method include following steps.

Referring to FIGS. 6 to 13, a substrate 100 is provided; active pillars 10 arranged in an array are formed on a surface of the substrate 100, where the active pillars 10 channel regions, and a top doped region positioned on an upper side of the channel region and a bottom doped region positioned on a lower side of the channel region.

The substrate 100 may be a semiconductor substrate 100 or a silicon-on-insulator substrate. In some embodiments, the substrate 100 may be a silicon substrate. In some other embodiments, the substrate 100 may also be a germanium substrate, a silicon germanium substrate or a silicon carbide substrate.

Referring to FIGS. 6 to 9, in some embodiments, the forming the active pillars 10 arranged in the array on the surface of the substrate 100 includes: providing an initial substrate 1; performing an etching process on the initial substrate 1 to form second trenches arranged at intervals along the first direction X (referring to FIG. 1) and extending along the second direction Y (referring to FIG. 1). In some embodiments, the etching process may include: patterning the initial substrate 1; and etching the patterned initial substrate 1 to form second trenches 12. In some embodiments, the etching process may be either a dry etching process or a wet etching process.

First isolation layers 2 are filled in the second trenches 12; and the first isolation layers 2 are configured to isolate bit lines formed subsequently. In some embodiments, the first isolation layers 2 may be formed in the second trenches 12 by means of a deposition process, where the deposition process may be either an atomic layer deposition process or a thermal oxidation process. A material of the first isolation layers 2 may be silicon oxide.

Referring to FIGS. 10 to 13, the etching process is performed on the initial substrate 1 and the first isolation layers 2 to form first trenches 13 arranged at intervals along the second direction Y and extending along the first direction X, to form the active pillars 10 at gaps between the first trenches 13 and at gaps between the second trenches 12. In the initial substrate 1, regions other than the active pillars 10 are configured to form the substrate 100. In some embodiments, the forming the first trenches 13 may include: forming mask layers 20 on the initial substrate 1 and top surfaces of the first isolation layers 2; performing a patterning process on the mask layers 20; and performing an etching process on the patterned mask layers 20 to form the first trenches 13 having a preset depth in the initial substrate 1, and to form the plurality of active pillars 10 arranged at intervals. In some embodiments, a material of the mask layers 20 may be silicon oxide, and after the etching process is performed, the mask layers 20 positioned on the top surfaces of the active pillars 10 may not be removed, such that the mask layers 20 can protect the top surfaces of the active pillars 10 in the process of continuing etching the surface of the substrate 100 exposed by first grooves 11 to form initial grooves 14.

In some embodiments, the mask layers 20 may be patterned by means of a self-aligned double patterning (SADP) process or a self-aligned quadruple patterning (SAQP) process. The SADP process or the SAQP process can form a smaller-sized pattern, which is advantageous to improving fineness of the process of patterning the initial substrate 1, to forming the smaller-sized active pillars 10, and to reducing the size of the semiconductor structure.

Depths of the first trenches 13 are smaller than depths of the second trenches 12. Because the substrate 100 corresponding to the first trenches 13 needs to be etched subsequently to form the initial grooves 14, and to form bit lines 102 in the initial grooves 14, such that the bit lines 102 and the bottom doped regions of the active pillars 10 form the bit lines 102, and the second trenches 12 are configured to isolate adjacent bit lines 102. That is, the depths of the first grooves 11 are related to the depths of the bit lines 102 subsequently formed in the substrate 100. The larger the depths of the first grooves 11 are, the larger the depths of the bit lines 102 in the substrate 100. Therefore, the depths of the second trenches 12 are set to be greater than the depths of the first trenches 13, such that the first isolation layers 2 in the second trenches 12 have larger depths, thereby ensuring that the first isolation layers 2 can cover side walls of the bit lines 102 subsequently formed, to isolate the adjacent bit lines 102.

In some embodiments, after the active pillars 10 are formed, the method further includes performing a doping process on the active pillars 10 to form channel regions, and top doped regions and bottom doped regions positioned on two sides of the channel regions. The top doped regions are arranged on the sides of the channel regions distant from the substrate 100, and the bottom doped regions are arranged on the sides of the channel regions facing the substrate 100. The channel regions are configured to form the channel regions of the transistors, and the top doped regions and the bottom doped regions are respectively configured to form either sources or drains of the transistors. In some embodiments, the semiconductor pillars 10 may be doped by means of any one of ion implantation or thermal diffusion.

In some other embodiments, the initial substrate 1 may also be doped before the active pillars 10 are formed, such that after the mutually independent active pillars 10 are formed, the active pillars 10 have the channel regions, the top doped regions, and the bottom doped regions.

Referring to FIGS. 14 to 21, the bit lines 102 are formed, where the bit lines 102 extend along the second direction Y and are electrically connected to the bottom doped regions of a column of the active pillars 10 arranged along the second direction Y, and in the direction facing away from the surface of the substrate 100, the bit lines 102 have the grooves 11 between bottoms of adjacent active pillars 10 connected to the bit lines 102.

In some embodiments, the forming the bit lines 102 may include following steps.

Referring to FIGS. 14 to 18, first sacrificial layers 21 are formed on side walls of the first trenches 13. The first sacrificial layers 21 can protect the side surfaces of the active pillars 10 exposed by the first trenches 13, to prevent from causing process damages to active pillars 10 during the process of subsequently etching the substrate 100 exposed at the bottoms of the first trenches 13. In some embodiments, a material of the first sacrificial layers 21 may be silicon oxide, and the forming the first sacrificial layers 21 may include: forming the first sacrificial layers 21 on the side surfaces of the active pillars 10 exposed from the side walls of the first grooves 11 by means of, for example, an atomic layer deposition process or a thermal oxidation process.

After the first sacrificial layers 21 are formed, self-aligned etching is performed on the bottoms of the first trenches 13 to form the initial grooves 14. In some embodiments, self-aligned etching is performed on the substrate 100 exposed at the bottoms of the first trenches 13 to form the initial grooves 14, and the initial grooves 14 expose surfaces of the bottom doped regions of the active pillars 10. In this way, after the bit lines 102 are formed on the side walls of the initial grooves 14, the bit lines 102 may be electrically connected to the bottom doped regions of the active pillars 10.

In some embodiments, along the first direction X, the widths of the first trenches 13 are smaller than the widths of the initial grooves 14, making the widths of the grooves 11 formed subsequently larger, such that after the word line isolation structure 103 are formed in the first trenches 13 and the grooves 11, the widths of the protruding portions 112 in the grooves 11 may be greater than the widths of the bodies 111 in the first trenches 13, such that the centers of gravity of the word line isolation structures 103 move toward the direction of the substrate 100, which is advantageous to improving the stability of the word line isolation structures 103.

Figure 15:
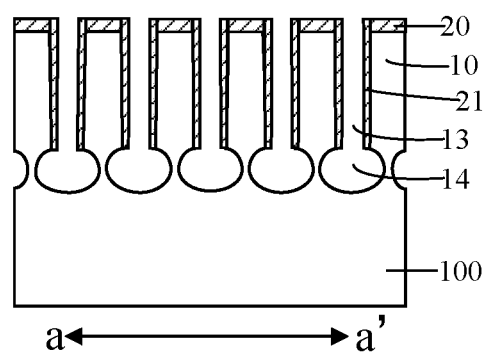
Figure 16:
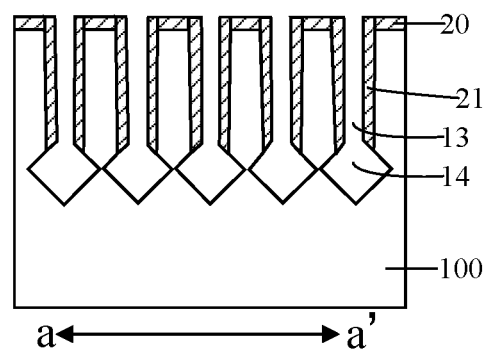

Referring to FIG. 15, in some embodiments, along the second direction Y, the cross-sectional shapes of initial grooves 14 may be an ellipse. Referring to FIG. 16, in some other embodiments, along the second direction Y, the cross-sectional shapes of the initial grooves 14 may also be a polygon. In this way, after the bit lines 102 are subsequently formed on the inner walls of the initial grooves 14, the shapes of the bit lines 102 are consistent with the shapes of the initial grooves 14. That is, the bit lines 102 positioned between the adjacent active pillars 10 may also enclose the shapes of the grooves 11.

Figure 17:
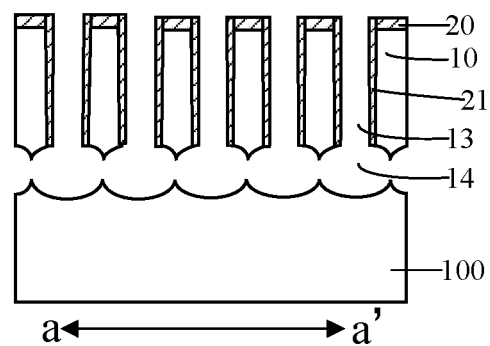
Figure 18:
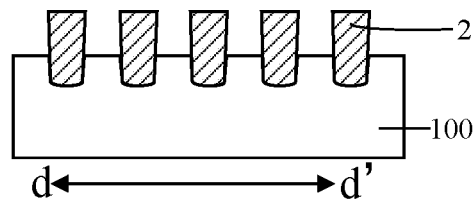

Referring to FIG. 15 and FIG. 16, in some embodiments, based on process reasons, along the second direction Y, the adjacent initial grooves 14 may be not communicated with each other. That is, part of the substrate 100 is also between the adjacent initial grooves 14. Referring to FIG. 17, in some other embodiments, along the second direction Y, the adjacent initial grooves 14 may also be communicated, such that when metals are subsequently deposited on the inner walls of the initial grooves 14 to form the bit lines 102, the bit lines 102 formed may be continuous film layers in the second direction Y, thereby improving the electrical transmission performance of the bit lines 102.

Figure 19:
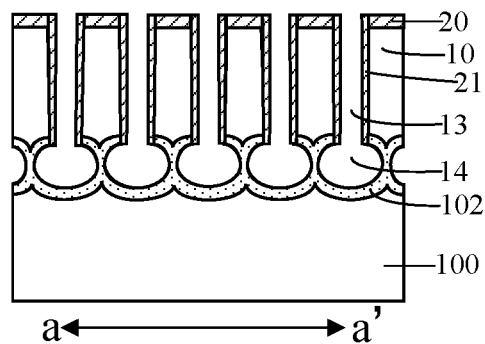
Figure 20:
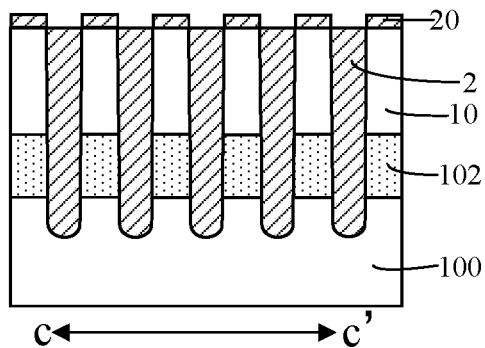
Figure 21:
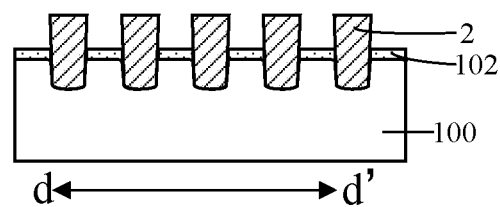

Referring to FIG. 19 to FIG. 21, metal layers or metal silicide layers are formed to cover the inner walls of the initial grooves 14, and the metal layers or metal silicide layers are communicated in the second direction Y to form the bit lines 102 and the grooves 11.

In some embodiments, when the adjacent initial grooves 14 are not communicated, and the substrate 100 is a silicon substrate 100, the materials of the bit lines 102 may only include metal silicides. That is, the silicon metallization process is performed on the substrate 100 between the adjacent initial grooves 14, such that the incompletely etched substrate 100 between the bottom doped regions of the adjacent active pillars 10 is converted into the metal silicides by means of the silicon metallization process, and the continuous film layers of the bit lines 102 extending in the second direction Y may be formed.

In some embodiments, the forming the bit lines 102 by means of a silicon metallization process may include: deposit metal layers on the inner walls of the initial grooves 14 by means of a deposition process, for example, a physical vapor deposition (PVD), where a material of the deposited metal layers may include any one of titanium, cobalt or nickel. Next, first rapid thermal annealing (RTA) is performed on the metal layers, where annealing temperature of the first RTA is lower (compared with annealing temperature of a second RTA), and the first RTA can allow the metal layers to react with silicon to form high-impedance-state metal silicides. After the first RTA, selective wet etching is performed to remove the unreacted metal layers, and then the second RTA is performed. The second RTA has a higher annealing temperature (compared to the annealing temperature of the first RTA). The second RTA can convert the high-impedance-state metal silicides into low-impedance-state metal silicides, and the low-impedance-state metal silicides are used as the bit lines 102, such that the bit lines 102 have better electrical properties.

In some other embodiments, when the adjacent initial grooves 14 are communicated, the materials of the bit lines 102 may also be metals, and the metals have a lower resistance, which is advantageous to improving the electrical transmission performance of the bit lines 102. Moreover, because the adjacent initial grooves 14 are communicated with each other, the metals deposited on the inner walls of the grooves 11 may better form the continuous film layers. In some embodiments, the metals may be deposited on the inner walls of the initial grooves 14 by means of a deposition process, such as the physical vapor deposition, to form the bit lines 102, where materials of the bit lines 102 may be, for example, at least one of tungsten, molybdenum, titanium, cobalt or ruthenium.

In some other embodiments, the materials of the bit lines 102 may also be the metal silicide layers and the metal layers stacked in sequence along a direction distant from the bit lines 102.

Referring to FIG. 22 to FIG. 31, after the bit lines 102 are formed, the word line isolation structures 103 are formed. The word line isolation structures 103 extend along the first direction X. The first direction X and the second direction Y are perpendicular to each other and parallel to the surface of the substrate 100. The word line isolation structures 103 include the bodies 111 and the protruding portions 112 extending from the bottoms of the bodies 111; and the protruding portions 112 are embedded in the grooves 11. The word line isolation structures 103 are configured to isolate the adjacent word lines 101 extending along the first direction X that are formed subsequently. The protruding portions 112 of the word line isolation structures 103 are embedded in the grooves 11, such that in the subsequent process of forming the word lines 101, when the sacrificial layers on two sides of the word line isolation structures 103 are removed to expose the side surfaces of the active pillars 10 in the channel regions, because the protruding portions 112 are embedded in the grooves 11, the support force may be provided to two sides of the word line isolation structures 103, such that the word line isolation structures 103 are not prone to tilt or collapse.

In some embodiments, the forming the word line isolation structures 103 includes following steps.

Figure 22:
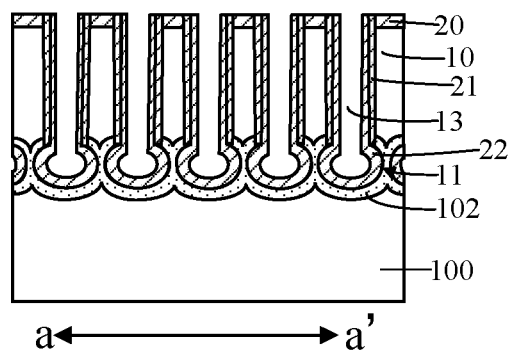
Figure 23:
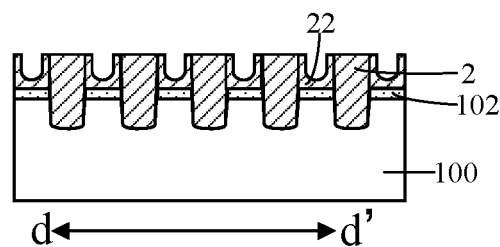
Figure 24:
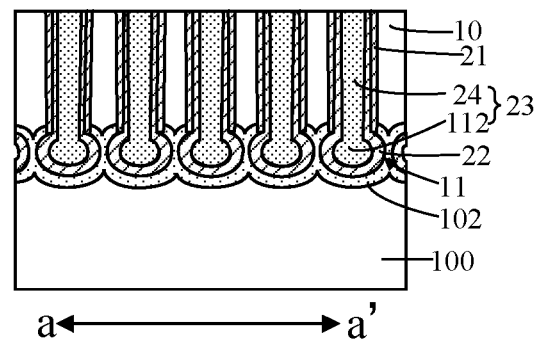
Figure 25:
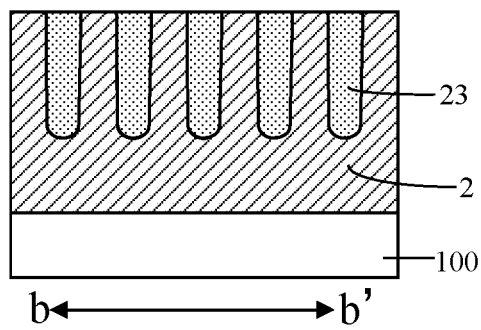
Figure 26:
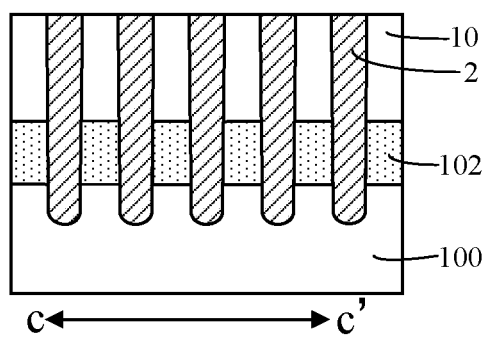
Figure 27:
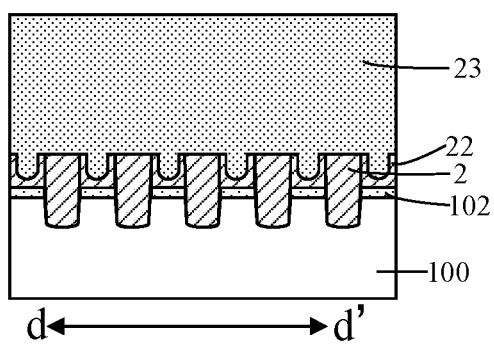
Figure 28:
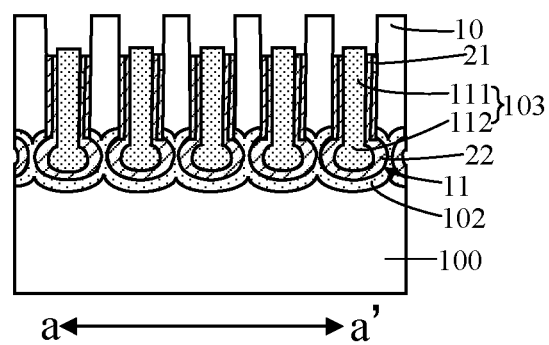
Figure 29:
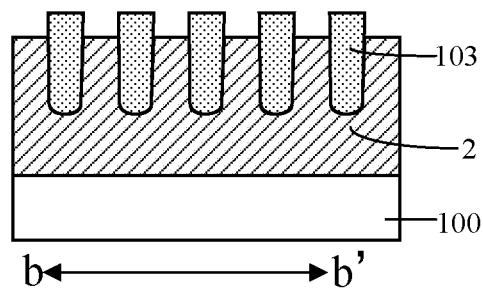
Figure 30:
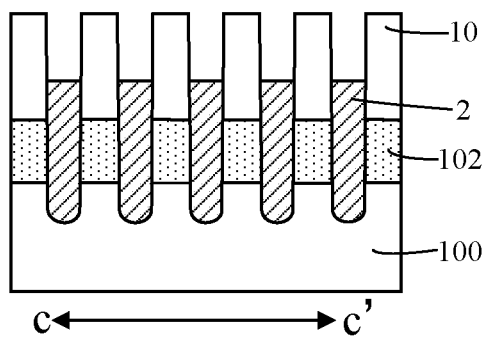
Figure 31:
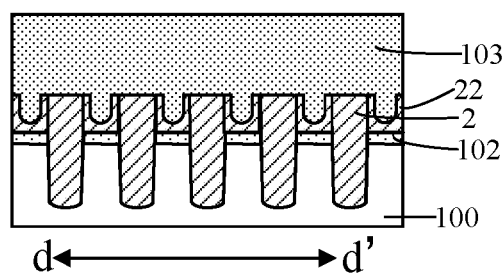

Referring to FIGS. 22 to 23, after the bit lines 102 are formed, second sacrificial layers 22 are formed on the inner walls of the first trenches 13, and the second sacrificial layers 22 cover the first sacrificial layers 21 and the metal layers or metal silicide layers in the grooves 11. The second sacrificial layers 22 are arranged on the surfaces of the metal layers or metal silicide layers of the initial grooves 14. That is, the second sacrificial layers 22 are positioned on the surfaces of the bit lines 102 in the initial grooves 14, such that shapes of the second sacrificial layers 22 correspond to shapes of the grooves 11. The thicker the second sacrificial layers 22 are, the smaller the width sizes of the protruding portions 112 subsequently deposited in the grooves 11 are; and the thinner the second sacrificial layers 22 are, the larger the width sizes of the protruding portions 112 subsequently deposited in the grooves 11 are. In this way, the width sizes of the protruding portions 112 may be controlled by controlling deposition thicknesses of the second sacrificial layers 22.

In addition, forming the second sacrificial layers 22 in the initial grooves 14 may also prevent the problem of damage to the bit lines 102 caused by the protruding portions 112 formed subsequently directly contacting the bit lines 102. That is, the second sacrificial layers 22 also achieve a buffer effect.

In some embodiments, the second sacrificial layers 22 may be formed on the surfaces of the first sacrificial layers 21 and the surfaces of the bit lines 102 by means of a deposition process.

Referring to FIG. 24 to FIG. 27, after the second sacrificial layers 22 are formed, second isolation layers 23 are formed to fill the remaining space in first trenches 13, the second isolation layers 23 include initial bodies 24 and the protruding portions 112 extending from the bottoms of the initial bodies 24, and the protruding portions 112 are embedded in the grooves 11. The protruding portions 112 are embedded in the grooves 11, such that the shapes of the protruding portions 112 are consistent with the shapes of the grooves 11. That is, the shapes of the protruding portions 112 formed may be controlled by controlling the shapes of the grooves 11 formed. Therefore, in some embodiments, along the second direction Y, when the cross-sectional shapes of the grooves 11 formed are an ellipse or a polygon, the cross-sectional shapes of the protruding portions 112 formed are also correspondingly an ellipse or a polygon. The cross-sectional shapes of the protruding portions 112 are set to be an ellipse or a polygon, such that the protruding portions 112 may be more firmly embedded in the grooves 11, thus the protruding portions 112 are not easy to slip from the grooves 11. In this way, the problem that the word line isolation structures 103 are prone to distortion or tilt may be further improved.

In some embodiments, the second isolation layers 23 may be deposited in the first trenches 13 and the remaining space of the grooves 11 by means of a deposition process such as an atomic layer deposition process, where a material of the second isolation layers 23 may be silicon nitride, which has better hardness and insulating properties, and can play a better role in isolating the word lines.

Referring to FIGS. 28 to 31, the second isolation layers 23 are etched back to form the word line isolation structures 103. Etching back the word line isolation structures 103 can reduce the heights of the word line isolation structures 103, thereby reducing a length-width ratio of the word line isolation structures 103, which can further prevent the occurrence of the problem that the word line isolation structures 103 are prone to collapse caused by larger length-width ratio of the word line isolation structures 103 after the first sacrificial layers 21 and the second sacrificial layers 22 on the side surfaces of the word line isolation structures 103 are etched subsequently.

In some embodiments, the etching back the second isolation layers 23 includes: performing first etch-back on the initial bodies 24 of the second isolation layers 23, and the first isolation layers 2, the first sacrificial layers 21 and the second sacrificial layers 22 positioned between adjacent active pillars 10 until the bodies 111 are formed and the top doped regions are exposed; where top surfaces of the bodies 111 are not lower than top surfaces of the channel regions. That is, in the step of performing the first etch-back on the second isolation layers 23, the first isolation layers 2 between the adjacent active pillars 10 and the first sacrificial layers 21 and the second sacrificial layers 22 positioned on the side walls of the second isolation layers 23 are also etched. The first isolation layers 2 are etched to expose the entire side surfaces of the top doped regions of the active pillars 10, to provide filling openings for the subsequent formation of the word lines 101.

The etching of the first sacrificial layers 21 and the second sacrificial layers 22 only exposes the side surfaces of the active pillars 10 in the top doped regions, such that after the first etch-back, the height difference between the first sacrificial layers 21, the second sacrificial layers 22 and the bodies 111 is not too large, and thus the first sacrificial layers 21 and the second sacrificial layers 22 may also support the side walls of the bodies to prevent collapse of the bodies 111. In some embodiments, after the first etch-back process, the heights of the first sacrificial layers 21 and second sacrificial layers 22 formed may be lower than the heights of the bodies 111. In this way, in one aspect, the first sacrificial layers 21 and the second sacrificial layers 22 may support the bodies 111; and in another aspect, the heights of the bodies 111 may not be too small, such that the bodies 111 may isolate the adjacent word lines 101.

In some embodiments, a material of the first sacrificial layers 21, a material of the second sacrificial layers 22 and a material of the first isolation layers 2 include silicon oxide, and a material of the second isolation layers 23 includes silicon nitride. Silicon oxide and silicon nitride have a larger etching selectivity, such that in the same first etch-back process, silicon oxide and silicon nitride may be etched simultaneously, and silicon oxide and silicon nitride may be not consistent in degree of etching.

In some embodiments, the first etch-back process may be a wet etching process, which has a larger etching selectivity for silicon oxide, such that the first etch-back process has a larger etching amount for the first sacrificial layers 21 and the second sacrificial layers 22.

In some embodiments, the etching selectivity of the first etch-back on silicon oxide and silicon nitride is 5 to 20. Within this etching selection range, the amount of the silicon oxide etched by the first etch-back is large, such that after the first etch-back, the heights of the first sacrificial layers 21 and second sacrificial layers 22 formed will be lower than the heights of the bodies 111 formed. Thus, the first sacrificial layers 21 and the second sacrificial layers 22 may better support both sides of the bodies 111. In another aspect, within this range, the etching amount of silicon oxide in the first etch-back is not too large, which may prevent the heights of remaining part of the first sacrificial layers 21 and remaining part of the second sacrificial layers 22 after the first etch-back process from being too low to better provide support force to the bodies 111.

It is to be understood that, in some other embodiments, the first etch-back process may also only etch silicon nitride, and the first sacrificial layers 21 and the second sacrificial layers 22 positioned on two sides of silicon nitride may also support the bodies 111 to prevent tilt or collapse of the bodies 111.

In some embodiments, the first etch-back process may etch away the silicon nitride by a height of 10 nm to 80 nm. Within this range, the bodies 111 formed may still retain a high height, such that the bodies 111 may better isolate the adjacent word lines 101.

Figure 32:
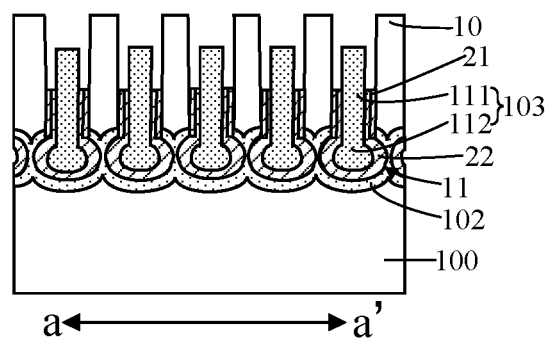
Figure 33:
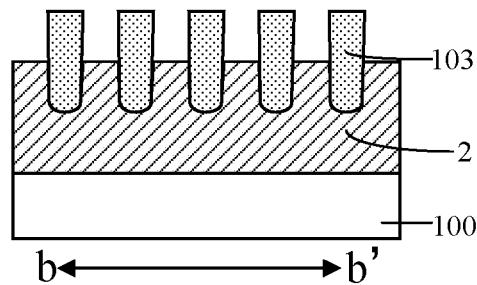
Figure 34:
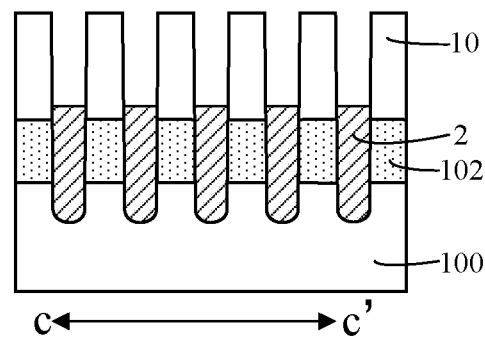
Figure 35:
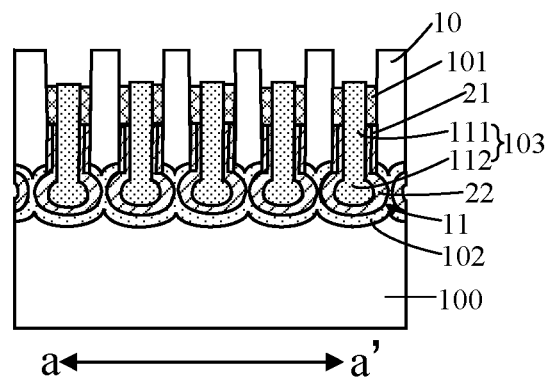
Figure 36:
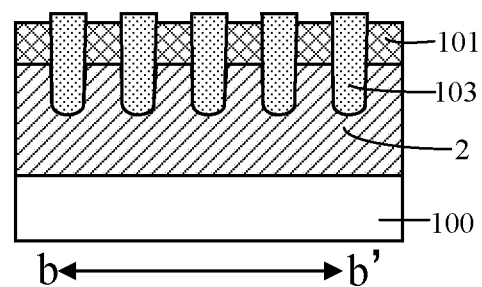
Figure 37:
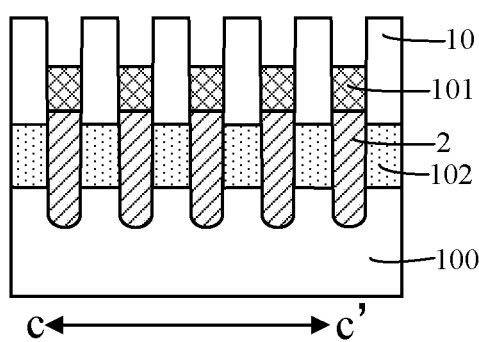

Referring to FIG. 32 to FIG. 37, after the first etch-back is performed, the word lines 101 are formed. In some embodiments, the method for forming the word lines 101 includes:

Referring to FIG. 32 to FIG. 34, after the bodies 111 are formed and the top doped regions are exposed, second etch-back is further performed on the first isolation layers 2, the first sacrificial layers 21 and the second sacrificial layers 22 positioned between the adjacent active pillars 10 until the channel regions are exposed. The second etch-back process only etches the first isolation layers 2, the first sacrificial layers 21 and the second sacrificial layers 22, but does not continue etching the bodies 111, such that only the side walls of the channel regions of the active pillars 10 may be exposed. After the word lines 101 are formed on the side walls of the active pillars 10 in the channel regions, the bodies 111 may isolate the adjacent word lines 101. In some embodiments, the second etching process may also be a wet etching process. By adjusting the etching selectivity of the wet etching process on the silicon oxide and the silicon nitride, only the silicon oxide is etched, but the silicon nitride is not etched. A chemical wet etching process may be used. For example, hydrogen fluoride may be configured for etching.

It is not difficult to find that, in the embodiments of the present disclosure, by etching the first sacrificial layers 21 and the second sacrificial layers 22 twice, the word line isolation structures 103 formed are prevented from being distorted or collapsed. The first etch-back process only etches part of the first sacrificial layers 21 and the second sacrificial layers 22 to expose the side walls of the active pillars 10 in the top doped regions, to support the bodies 111. The second etch-back process etches the first sacrificial layers 21 and the second sacrificial layers 22 again to expose the side walls of the active pillars 10 in the channel regions. Compared to exposing the side edges of the active pillars 10 in the channel regions by only etching the first sacrificial layers 21 and the second sacrificial layers 22 once, the problem that the word line isolation structures 103 are collapsed due to excessive amount of once etching may be prevented.

After the channel regions are exposed, gate oxide layers (not shown in the figure) are formed on the surfaces of the channel regions. In some embodiments, a deposition process, such as an atomic layer deposition process or a thermal oxidation process, may be configured to form the gate oxide layers on the surfaces of the active pillars 10 in the channel regions. The materials of the gate oxide layers may be silicon oxide.

The word lines 101 are formed on the sides of the gate oxide layers distant from the channel regions, and the top surfaces of the word lines 101 are not higher than the top surfaces of the word line isolation structures 103, such that the word line isolation structures 103 may better isolate the adjacent word lines 101. In some embodiments, the word lines 101 may be formed on the surfaces of the gate oxide layers distant from the channel regions by means of the deposition process. The materials of the word lines 101 may be at least one of polysilicon, tungsten, molybdenum, titanium, cobalt, or ruthenium.

Referring to FIGS. 2 to 5, in some embodiments, after the word lines 101 are formed, the method further includes: forming capping layers, where the capping layers cover the top surfaces of the word lines 101 and the top surfaces of the word line isolation structures 103, and fill the voids between the adjacent top doped regions. The capping layers play a role of protecting the tops of the word lines 101 to prevent from causing process damages to the word lines 101 in the process of actually fabricating the semiconductor structure. Moreover, the capping layers are also configured to isolate the word lines 101 from other conductive structures in the semiconductor structure, to prevent the problem of electrical interference between the word lines 101 and the other conductive structures in the semiconductor structure. In some embodiments, a material of the capping layer may be silicon nitride. The forming the capping layers may include: depositing initial capping layers (not shown) on the top surfaces of the word lines 101 of the first trenches 13 and on the top surfaces of the word line isolation structures 103, where the initial capping layers are higher than the top surfaces of the active pillars 10, and the initial capping layers are also positioned on the top surfaces of the active pillars 10; performing a chemical mechanical polishing process on the initial capping layers to ensure the top surfaces of the initial capping layers to be flat; and removing the initial capping layers positioned on the top surfaces of the active pillars 10 and the initial capping layers higher than the top surfaces of the active pillars 10, to form the capping layers.

In the method for fabricating the semiconductor structure provided in the above embodiment, the bit lines 102 are formed, the bit lines 102 are electrically connected to the bottom doped regions of a column of the active pillars 10, and the bit lines 102 have the grooves 11 between the adjacent active pillars 10. The word line isolation structures 103 are formed, and the protruding portion 112 of the word line isolation structures 103 are embedded in the grooves 11, thus providing support force to two sides of the word line isolation structures 103. Even in the process of forming the word lines 101, the two sides of the word line isolation structures 103 are exposed to air. Because the protruding portions 112 are embedded in the grooves 11 to provide the support force to the word line isolation structures 103, and thus the word line isolation structures 103 are not prone to tilt or collapse.

What is claimed is:

1. A semiconductor structure, comprising:
a substrate, a plurality of active pillars arranged in an array being provided on a surface of the substrate, and each of the plurality of active pillars comprising a channel region, and a top doped region positioned on an upper side of the channel region and a bottom doped region positioned on a lower side of the channel region;
a plurality of word lines, a given one of the plurality of word lines extending along a first direction and surrounding the channel regions of a row of the plurality of active pillars arranged along the first direction;
a plurality of bit lines, a given one of the plurality of bit lines extending along a second direction and being electrically connected to the bottom doped regions of a column of the plurality of active pillars arranged along the second direction, and in a direction facing away from the surface of the substrate, the given one of the plurality of bit lines having a plurality of grooves, a given one of the plurality of grooves being between bottoms of given adjacent two of the plurality of active pillars connected to the given one of the plurality of bit lines; and
a plurality of word line isolation structures, a given one of the plurality of word line isolation structures being positioned between given adjacent two of the plurality of word lines, the given one of the plurality of word line isolation structures comprising a body and a plurality of protruding portions extending from bottom of the body, and a given one of the plurality of protruding portions being embedded in the given one of the plurality of grooves;
wherein the first direction and the second direction are perpendicular to each other, and are both parallel to the surface of the substrate.

2. The semiconductor structure according to claim 1, wherein along the second direction, a width of a given one of the plurality of protruding portions is greater than a width of the body.

3. The semiconductor structure according to claim 2, wherein along the second direction, a ratio of a maximum width of the given one of the plurality of protruding portions to the width of the body is 1.5 to 2.

4. The semiconductor structure according to claim 3, wherein along the second direction, the width of the given one of the plurality of protruding portions is 5 nm to 20 nm.

5. The semiconductor structure according to claim 2, wherein in a direction perpendicular to the surface of the substrate, a ratio of a height of the body to a height of the given one of the plurality of protruding portions is 5 to 10.

6. The semiconductor structure according to claim 2, wherein along the direction facing away from the surface of the substrate, the width of the body in the second direction is gradually reduced.

7. The semiconductor structure according to claim 1, further comprising: a plurality of buffer layers, a given one of the plurality of buffer layers being positioned between a given one of the plurality of protruding portions and a given one of the plurality of bit lines, and the given one of the buffer layers further wrapping the given one of the plurality of protruding portions and filling voids between the given one of the plurality of protruding portions and the given one of the plurality of grooves.

8. The semiconductor structure according to claim 1, wherein the given one of the plurality of protruding portion fills up the given one of the plurality of grooves.

9. The semiconductor structure according to claim 1, further comprising: a plurality of capping layers, a given one of the plurality of capping layers being positioned on a side of a given one of the plurality of word line isolation structures distant from the substrate, and the given one of the plurality of capping layers further covering a top of a given one of the plurality of word lines and filling a void between given adjacent two of the top doped regions.

10. The semiconductor structure according to claim 1, further comprising: a plurality of gate oxide layers, a given one of the plurality of gate oxide layers being positioned between a given one of the channel regions and a given one of the plurality of word lines.

11. The semiconductor structure according to claim 1, wherein a material of a given one of the plurality of bit lines comprises at least one of metal silicide or metal.

* * * * *